United States Patent
Regis

(10) Patent No.: US 7,631,027 B2
(45) Date of Patent: *Dec. 8, 2009

(54) EFFICIENT MULTICHANNEL FILTERING FOR CDMA MODEMS

(75) Inventor: Robert T. Regis, Huntington, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 927 days.

This patent is subject to a terminal disclaimer.

(21) Appl. No.: 11/141,622

(22) Filed: May 31, 2005

(65) Prior Publication Data

US 2005/0223049 A1    Oct. 6, 2005

Related U.S. Application Data

(63) Continuation of application No. 10/304,308, filed on Nov. 25, 2002, now Pat. No. 6,907,024, which is a continuation of application No. 08/670,160, filed on Jun. 27, 1996, now Pat. No. 6,487,190.

(51) Int. Cl.
G06F 17/10 (2006.01)
H04B 7/216 (2006.01)

(52) U.S. Cl. .................................. 708/319; 370/342

(58) Field of Classification Search ............... 708/308, 708/316, 319; 370/342
See application file for complete search history.

(56) References Cited

U.S. PATENT DOCUMENTS 4,131,764 A    12/1978   Claasen et al.
4,425,665 A    1/1984    Stauffer
4,679,164 A *  7/1987    Rearick ................. 708/420
4,709,343 A    11/1987   Van Cang
4,771,395 A    9/1988    Watanabe et al.
4,799,179 A    1/1989    Masson et al.
4,811,262 A    3/1989    White
4,862,402 A    8/1989    Shah et al.
5,117,385 A    5/1992    Gee
5,140,613 A    8/1992    Birgenheier et al.

(Continued)

FOREIGN PATENT DOCUMENTS

EP    0 372 350    5/1990

(Continued)

OTHER PUBLICATIONS

Designing Digits Into Audio Equalisation; Electronics World and Wireless World; vol. 97, No. 1669; Dec. 1991; pp. 998-999, 1001-1003 and 1022-1023; See entire document.

*Primary Examiner*—Chuong D Ngo
(74) *Attorney, Agent, or Firm*—Volpe and Koenig, P.C.

(57) ABSTRACT

An efficient, multichannel filter for CDMA modems permits multiple serial, digital bit streams to be filtered by digital signal processing techniques including sample weighting and summing functions. Each individual channel may have custom weighting coefficients or weighting coefficients common for all channels. If the weighting coefficients are by adaption, the same approach may be taken. The multichannel FIR filter is implemented with no multipliers and a reduction in the number of adders. To increase the speed of operation, the filter structure utilizes look-up tables storing the weighting coefficients. The invention can be embodied as either as a field programmable gate array or an application specific integrated circuit. The use of look-up tables saves significant chip resources.

21 Claims, 11 Drawing Sheets

U.S. PATENT DOCUMENTS

| | | | |
|---|---|---|---|
| 5,222,035 A | 6/1993 | Nakase et al. | |
| 5,258,940 A | 11/1993 | Coker et al. | |
| 5,262,974 A | 11/1993 | Hausman et al. | |
| 5,287,299 A | 2/1994 | Lin | |
| 5,305,349 A | 4/1994 | Dent | |
| 5,311,459 A | 5/1994 | D'Luna et al. | |
| 5,343,335 A | 8/1994 | Hara | |
| 5,379,242 A | 1/1995 | Rose et al. | |
| 5,414,732 A | 5/1995 | Kaufmann | |
| 5,483,549 A | 1/1996 | Weinberg et al. | |
| 5,487,089 A | 1/1996 | Misazu et al. | |
| 5,596,570 A | 1/1997 | Soliman | |
| 6,456,608 B1 * | 9/2002 | Lomp | 370/335 |
| 6,487,190 B1 * | 11/2002 | Regis | 370/342 |
| 6,907,024 B2 * | 6/2005 | Regis | 370/342 |

FOREIGN PATENT DOCUMENTS

| | | |
|---|---|---|
| EP | 0 372 359 | 6/1990 |
| EP | 0 476 215 | 3/1992 |
| JP | 62-256516 | 11/1987 |
| JP | H2287874 | 11/1990 |
| JP | H4222111 | 8/1992 |
| JP | H4287593 | 10/1992 |
| JP | H5144128 | 6/1993 |
| JP | H6104694 | 4/1994 |
| JP | H7273600 | 10/1995 |
| WO | 92/00639 | 1/1992 |

\* cited by examiner

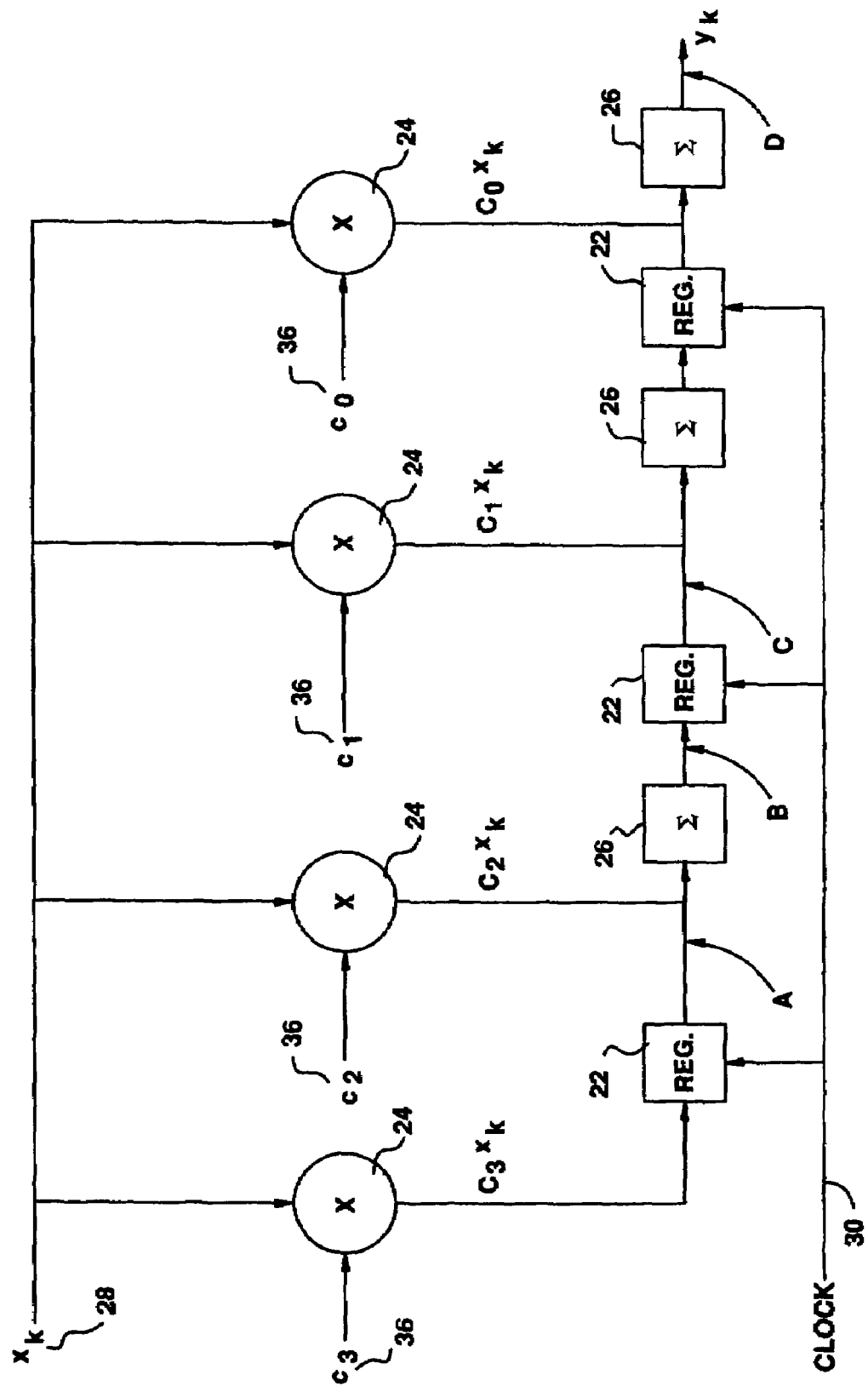

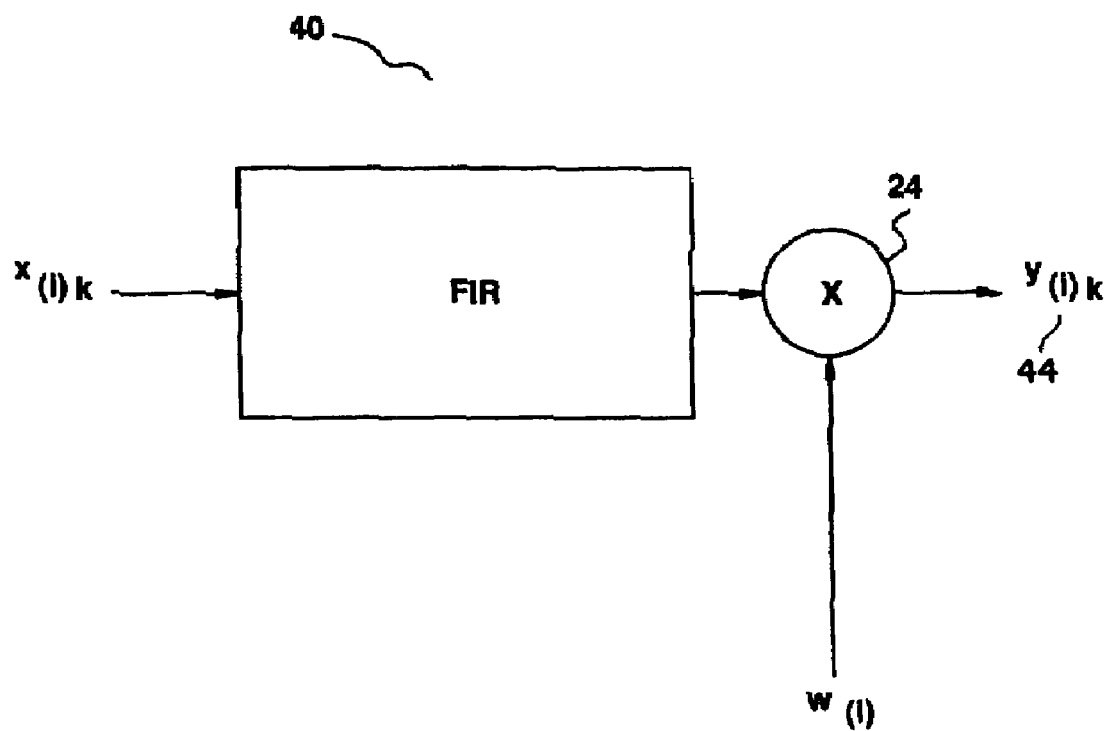

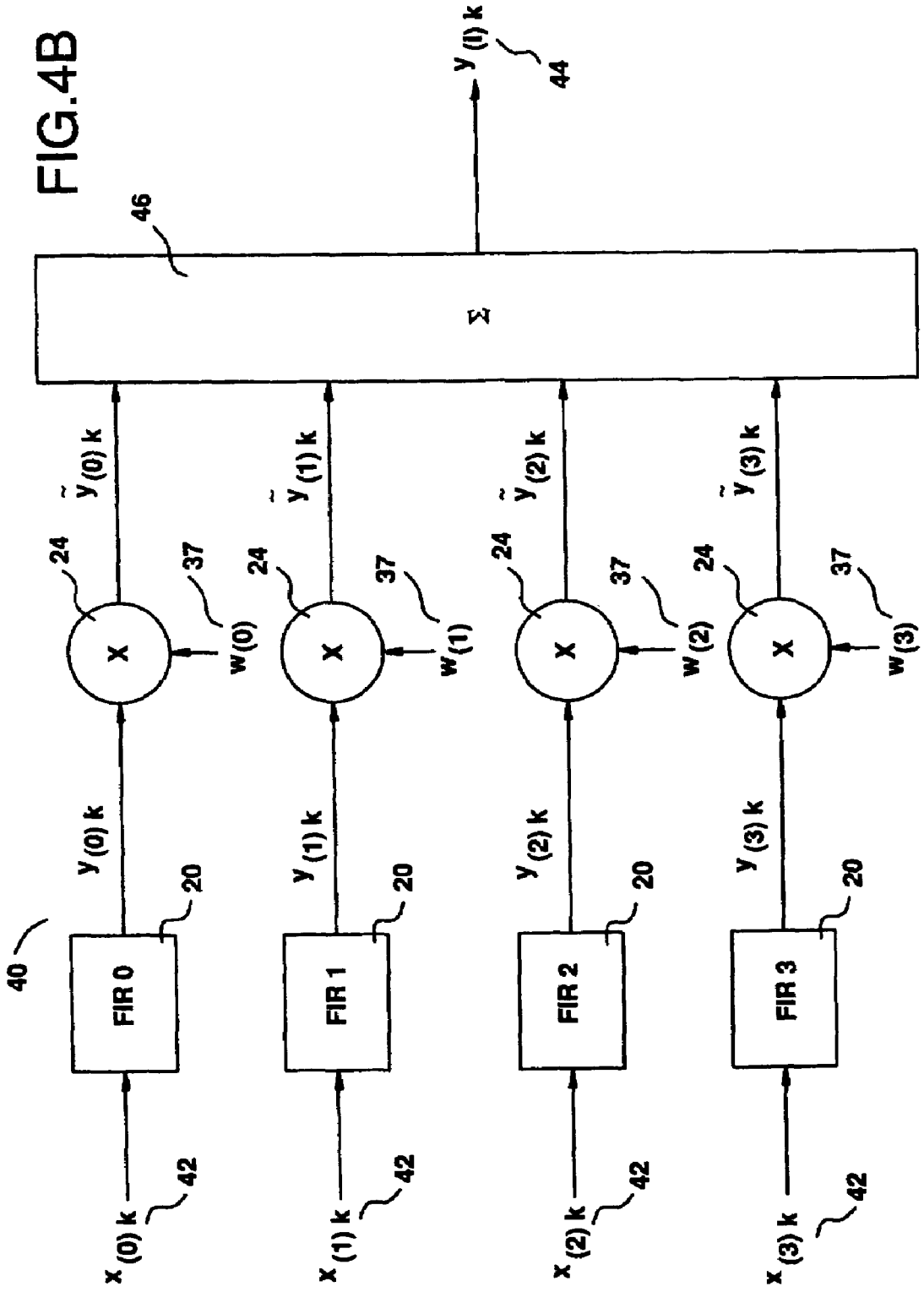

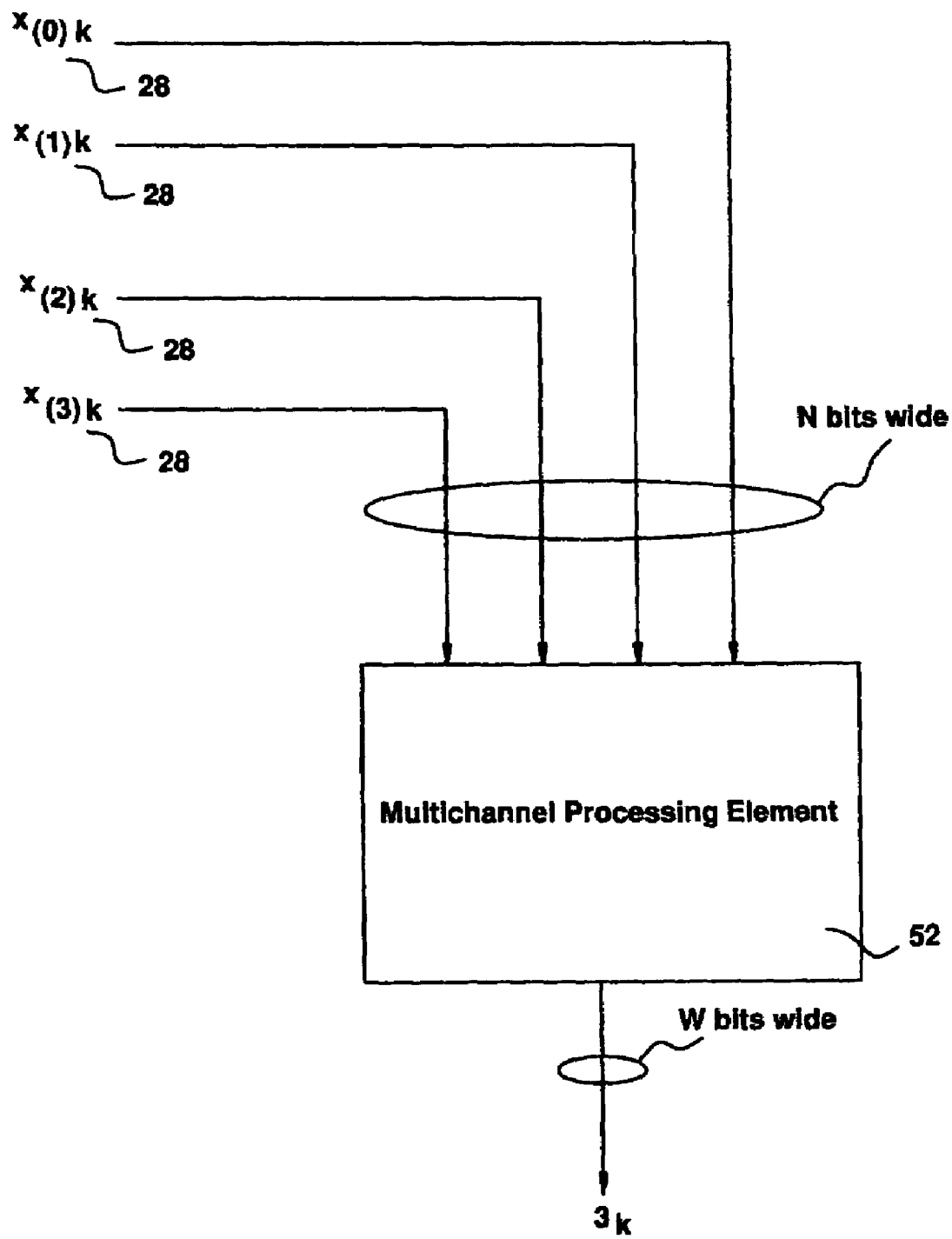

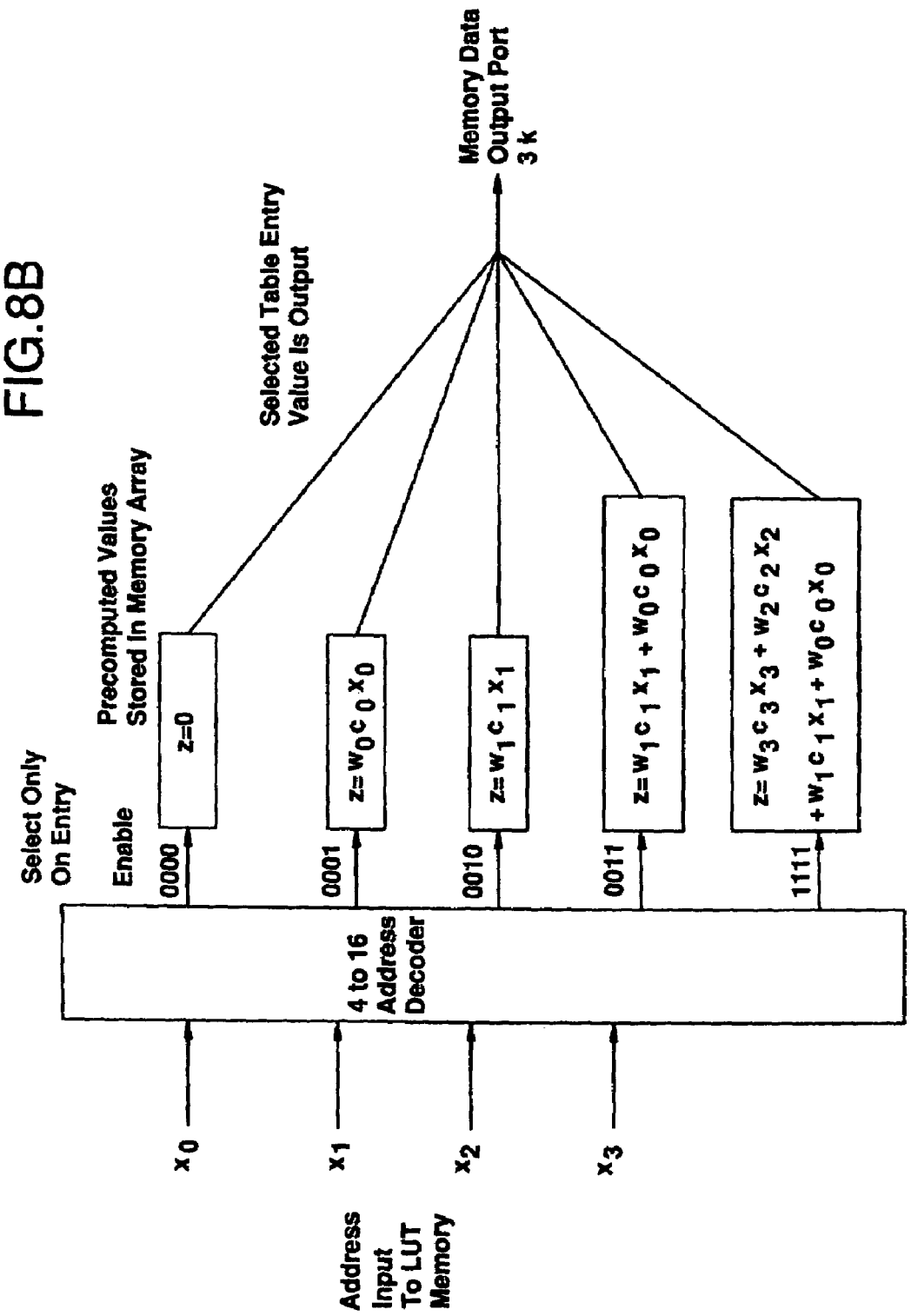

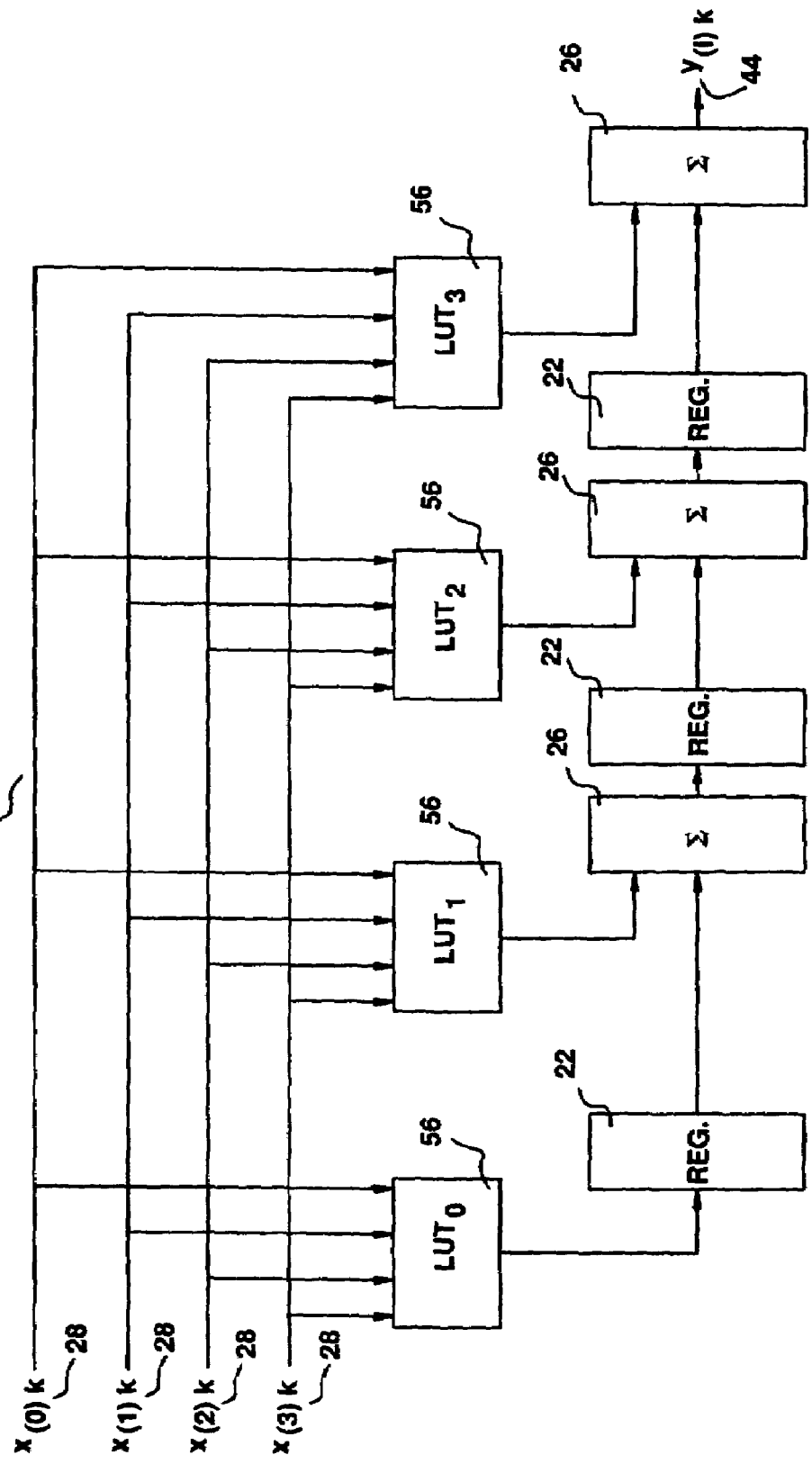

EFFICIENT MULTICHANNEL FILTERING FOR CDMA MODEMS

CROSS REFERENCE TO RELATED APPLICATION

This application is a continuation of U.S. application Ser. No. 10/304,308, filed Nov. 25, 2002 now U.S. Pat. No. 6,907,024, which is a continuation of U.S. application Ser. No. 08/670,160, filed Jun. 27, 1996, now U.S. Pat. No. 6,487,190, which application and patent are incorporated herein by reference as if fully set forth.

BACKGROUND OF THE INVENTION

The present invention relates generally to digital filtering techniques for code division multiple access telecommunication. More specifically, the invention relates to a high-speed, multi-channel, finite impulse response filter architecture which obviates multipliers throughout the filter structure.

Communications technology today includes the use of spread spectrum modulation or CDMA (code division multiple access) for point-to-multipoint telecommunications. CDMA has long been used in military applications due to the difficulty to detect and jam the transmission. This attribute is due to a wireless communication technique that uses a transmission bandwidth much greater than the information bandwidth of a given user. All users communicate with each other or a common receiver over the same bandwidth and are identified by a particular code. Multiple access is provided through the sharing of a large common bandwidth thereby increasing overall system performance.

High tolerance to intentional or unintentional interference and the ability to communicate with a large population of users in a common geographical area make CDMA communication techniques attractive for commercial applications. Since each user in a CDMA communication system transmits and receives data or communication signals over the same frequency bandwidth, guard band requirements are lessened and the capacity of the communication system increases.

Each communication channel within the communication system typically uses DSP (digital signal processing) hardware and software to filter, weight, and combine each signal prior to transmission. The weighting, filtering and combining of multiple signal channels is performed in the transmit circuitry of a CDMA communication system base station.

Prior art CDMA modems require many multipliers and binary adders for channel weighting and combining. The filter operation used is equivalent to that of a FIR (finite impulse response or transversal) structure. Each individual FIR filter used also requires many multipliers and adders.

A multiplier implemented in digital form is inefficient and expensive. The expense is directly related to logic gate count. Binary adders are less costly than binary multipliers, however, their use should be minimized. To implement a design using binary multiplication and addition into an ASIC (application specific integrated circuit) would be expensive to manufacture and would result in a more inefficient and slower signal throughput.

One disadvantage of FIR filters is the computational complexity required for each output sample. For example, for each output sample, N multiply-accumulate (MAC) operations need to be performed. To those knowledgeable in the state of the art, disclosed in U.S. Pat. No. 4,811,262 (White) and U.S. Pat. No. 4,862,402 (Shaw et al.) are digital filter structures obviating multipliers. Both referenced patents disclose a reduction or elimination of multipliers in digital FIR filters by storing the weighting coefficients in memory. However, neither referenced filter structure, or the prior art has been optimized for multichannel operation.

The disadvantage with prior art CDMA modems is the ability to weight, filter, and combine a plurality of single bit valued signal channels efficiently and accurately. When a multiplicity of signal processing channels are involved, the consistency between channels becomes important and the cost of hardware per channel escalates. In a CDMA communication system, it is necessary to use the minimum amount of power to achieve the minimum required BER (bit error rate) for maximum user capacity. Since CDMA communication systems allocate the same transmission bandwidth to all users, controlling the transmitted power of each user to the minimum required to maintain a given signal-to-noise ratio is paramount. Since each user employs a wide band signal occupying the entire frequency bandwidth for a finite duration, each user contributes to the overall background noise that effects all users. Therefore, the lack of power control will increase user-to-user interference.

Each channel must have appropriate individual weights applied so that the same relative amplitudes are transmitted. After the weighting operation, each data stream is represented by multibit values. These are typically summed together in a large digital summing circuit that consists of a tree of numerous two input adders.

The weighted and summed digital values are then filtered in a conventional FIR filter. The multipliers in the FIR process the multibit data and weighting coefficients to the desired precision. A multichannel filter for a CDMA modem constructed according to the teachings of the prior art would require separate FIR integrated circuits rather than total integration onto an economical ASIC (application specific integrated circuit).

Accordingly, there exists a need for a multichannel CDMA modem FIR filter architecture which uses weighting coefficients, either fixed or variable through adaptation, operating with the accuracy and speed of multiplierless filters.

SUMMARY OF THE INVENTION

The efficient, multichannel filter for CDMA modems of the present invention allows multiple channels consisting of serial, digital bit streams to be filtered by digital signal processing techniques performing sample weighting and summing functions. Each individual channel may have custom weighting coefficients or weighting coefficients common for all channels. If the weighting coefficients are by adaption, the same approach may be taken.

The multichannel FIR filter presented is implemented with no multipliers and a reduction in the number of adders. To increase the speed of operation, the filter structure utilizes LUTs (look-up tables) storing the weighting coefficients. The invention can be constructed either as a FPGA (field programmable gate array) or an ASIC (application specific integrated circuit). The use of LUTs save significant chip resources and manufacturing costs.

Accordingly, it is an object of the present invention to provide an efficient CDMA FIR filter structure for multichannel applications.

It is a further object of the invention to provide a multichannel FIR filter structure of reduced complexity and increased performance.

It is a further object of the invention to provide a multiplierless, multichannel FIR filter.

Other objects and advantages of the system and method will become apparent to those skilled in the art after reading the detailed description of the preferred embodiment.

BRIEF DESCRIPTION OF THE DRAWINGS

FIG. 3 is a block diagram of an alternative implementation of a prior art, single input FIR filter structure.

FIG. 4A is a block diagram of a single channel of a multi-channel FIR filter.

FIG. 4B is a detailed block diagram of a multichannel FIR filter.

FIG. 7 is a block diagram of the multichannel processing element.

FIG. 8B is a detailed block diagram showing the multi-channel LUT input of the present invention.

FIG. 9 is a detailed block diagram of the preferred embodiment.

DETAILED DESCRIPTION OF THE PREFERRED EMBODIMENT

Figure 1:
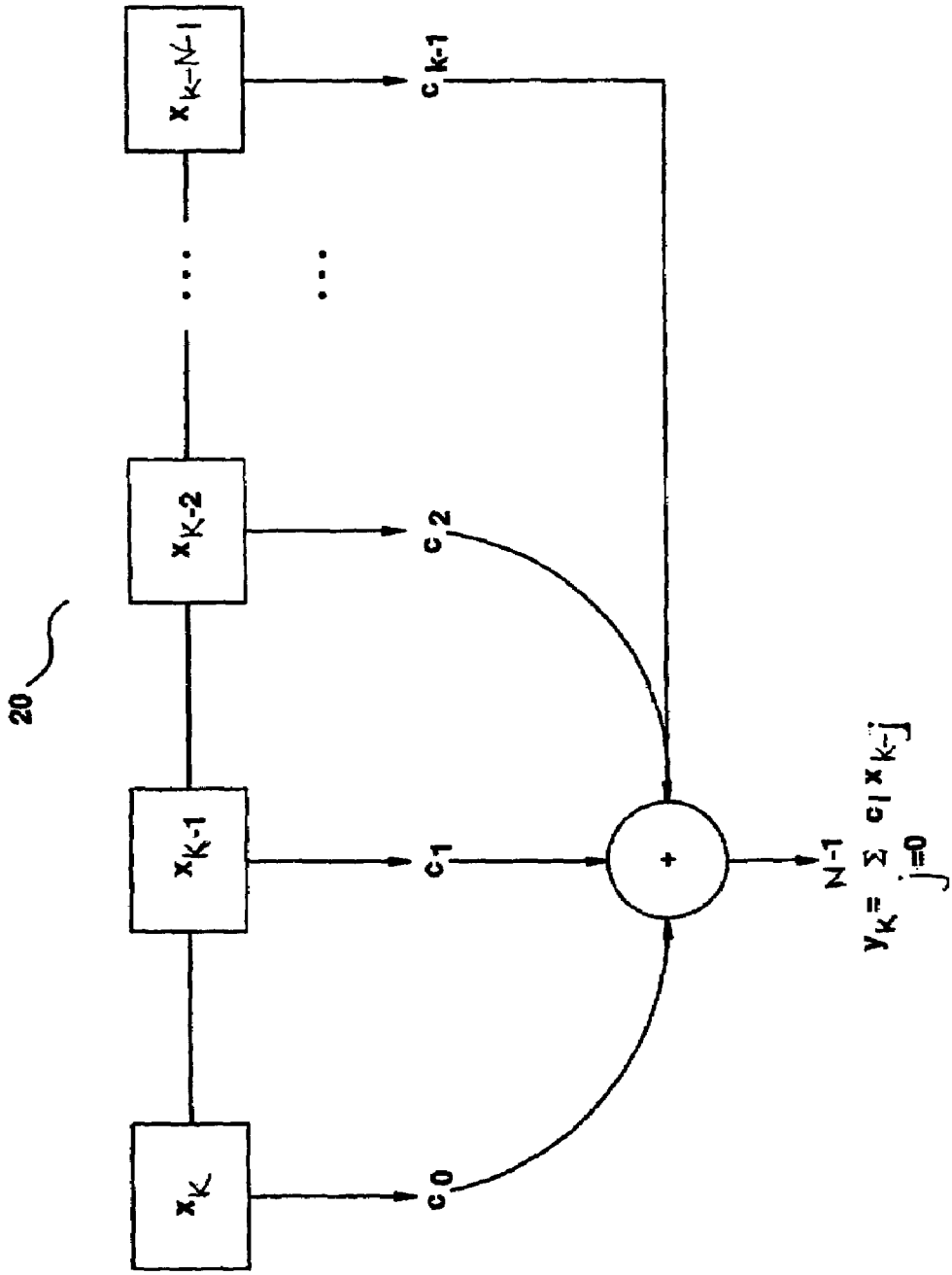
FIG. 1 is a block diagram of a typical, prior art, single input FIR filter.

A multichannel FIR filter for CDMA modems is described with reference to the drawing figures where like numerals represent like elements throughout. Such modems are used in multichannel wireless communication stations in conjunction with the transmission and reception of communication signals.

By way of background, many systems have the property of having their outputs at a given instant of time depend not only on the input at the time, but on the entire, or immediate history of the input. Such systems are said to have memory, averaging past and present samples in arriving at an output. It is necessary to separate systems with memory into the classes of discrete and continuous systems. A discrete system is one whose inputs and outputs are sequences of numerical values rather than continuous functions of time.

A sequence of discrete values can be represented as $x_k$, where the value x is a quantity such as voltage. The subscript k represents the sequence number. Very often in digital signal processing, $x_k$ represents a sampled waveform or signal where the subscript specifies the point in time at which the sample was taken. However, the subscript can represent an alternative meaning such as distance in a spatially sampled application. For a system to be physically realizable, the output must depend only on the present and past history of the input. No real system can have an output that depends on the future of the input. The dependence of the output of any physically realizable system on the input is indicated by $$y_k = f(x_k, x_{k-1}, x_{k-2}, \ldots, x_{k-n}), \tag{1}$$

where the input variables are $x_k$, the output variable is $y_k$, and $f(*)$ is any arbitrary function of n+1 variables. Although this function is too broadly defined to be analyzed in general, the subset of linear operations becomes very useful for a plurality of signal processing applications. These functions also prove to be much more tractable in analysis.

If the output depends on the previous n samples of the input (a system having a finite memory) in a linear fashion, Equation (1) can be written as $$y_k = \sum_{j=0}^{N} a_j x_{k-j} + b. \tag{2}$$

Such a linear system is characterized by the N+1 weighting variables $a_j$, and by the bias b. An unbiased, discrete linear system is characterized by the weighting variables ($a_0, a_1, \ldots, a_n$). If the input $x_k$ is a delta function (unity for one sample and zero for all others), it can be seen that the output of Equation (2) is the sequence of weighting variables $a_0, a_1, \ldots, a_n$. Therefore, the response to the input completely characterizes an unbiased, linear system.

There are certain types of linear systems with memory that can be analyzed using linear techniques. Even though digital signal processing is discrete by nature, if the input is samples of a continuous input and is sampled sufficiently fast, it is possible to simulate a continuous system using the samples as the input variables. The output then appears as a linear system with a long memory. One such system is a FIR filter 20. A fixed coefficient FIR filter is characterized by the input/output equation $$y_k = \sum_{j=0}^{N-1} c_i x_{k-j}, \tag{3}$$

as shown in FIG. 1, or expanded as $$y_k = c_0 x_k + c_1 x_{k-1} + \ldots + c_{k-1} x_{k-(N-1)}, \tag{4}$$

where the FIR filter has an impulse response $c_0, c_1, \ldots, x_k$ represents the discrete input signal samples at time k, $c_i$ are the filter coefficient weights, N are the number of taps, and $y_k$ represents the output at time k. As shown in FIG. 1, the block diagram forms a tapped delay line with the coefficients being known as tap weights.

Figure 2:
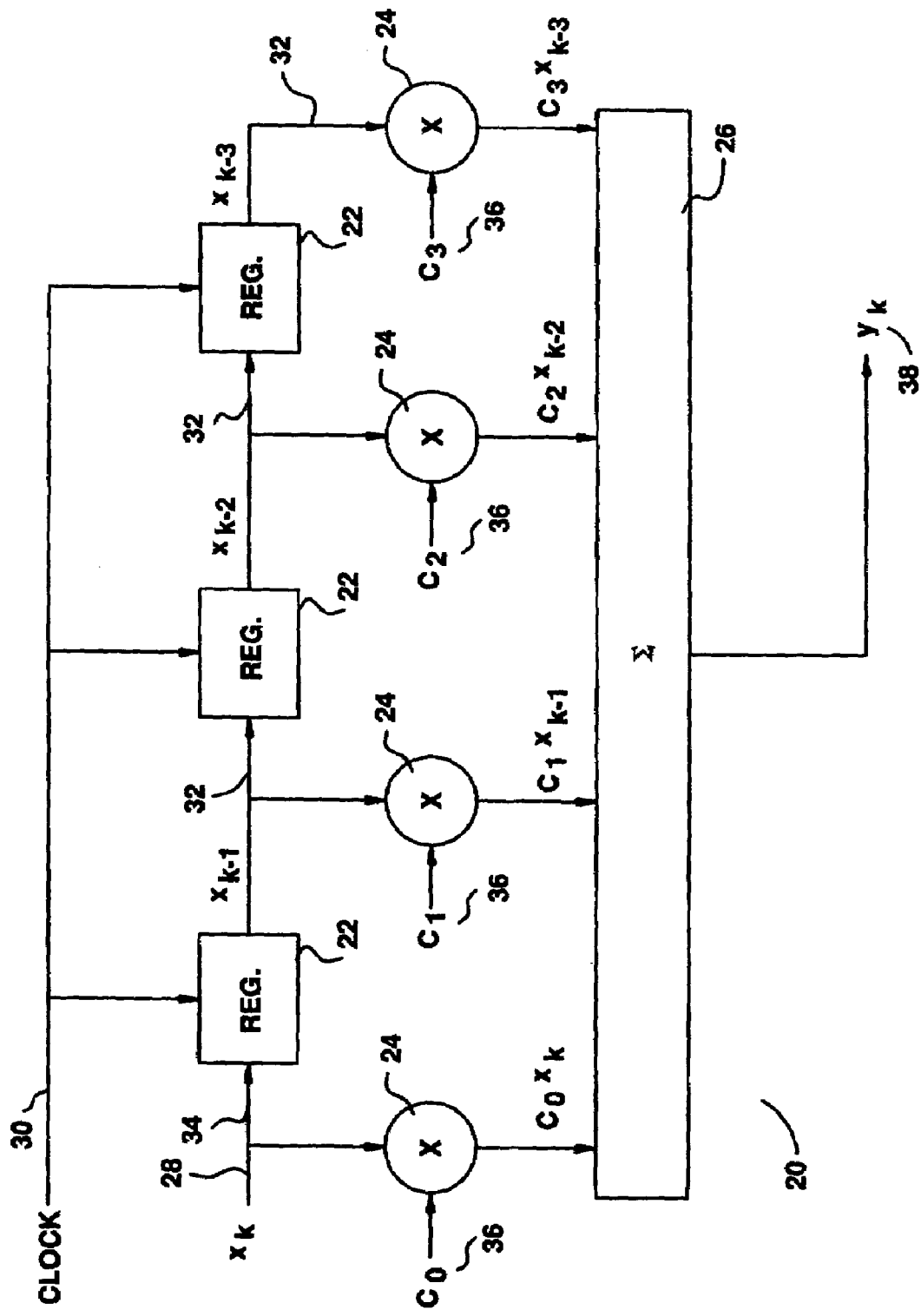
FIG. 2 is a block diagram of a typical, prior art, single input FIR filter structure.

Digital filters are presently a common requirement for digital signal processing systems. In the field of discrete systems, the most popular type of digital filter using convolution is the FIR. FIR filters have two advantages. The first is that FIR filters are inherently stable. The finite length of the impulse response guarantees that the output will go to zero within N samples. The second advantage is that FIR filters can be designed and implemented. The FIR filter 20 can be physically realized by using digital shift registers 22, multipliers 24 and summers 26 as shown in FIG. 2. The discrete signals 28 are shifted into registers 22 by a sampling clock pulse 30. The registers 22 hold past values 32 of the sampled signal 28 as well as present values 34 required for mathematical convolution. The past 32 and present 34 values are multiplied 24 by filter weighting coefficients 36, summed 26 and then output 38.

Another way of representing a FIR filter structure 20 is shown in FIG. 3. The operation described can be shown to be the equivalent of FIG. 2 since $$A = c_3 x_{k-1}, \tag{5}$$

$$B = c_3 x_{k-1} + c_2 x_k, \tag{6}$$

$$C = c_3 x_{k-2} + c_2 x_{k-1}, \tag{7}$$

resulting in $$D = y_k \qquad (8)$$
$$= c_3 x_{k-3} + c_2 x_{k-2} + c_1 x_{k-1} + c_0 x_k$$
$$= \sum_{j=0}^{3} c_j x_{k-j}$$
$$= c_k * x_k.$$

As can be seen in FIGS. 2 and 3 the weighting 36 of the discrete input samples 28 relies upon many multipliers 24.

A single channel of a multichannel FIR filter 40 for CDMA modems is shown in simplified form in FIG. 4A. The multichannel FIR filter 40 is shown as a single element with a multichannel input sequence $x_{(i)k}$ entering the filter 40 and the filtered result $y_{(i)k}$ exiting. The subscript Ai@ identifies which channel from a plurality channels is being filtered.

The multiple single bit data/signal streams represent serial data streams that have been modulated with a pseudo noise (PN) code sequence. Each channel could represent user traffic channels at various data rates. Various types of signaling data might comprise other channels.

A typical example of an ISDN (integrated service digital network) CDMA modem would require five channels. Two channels would be 64 Kbps traffic channels (B1 and B2), a 16 Kbps auxiliary signaling and packet channel (D), an order wire channel (OW), and a reverse automatic power control channel (APC).

For maximum user capacity in a CDMA system it is necessary to use the minimum amount of power to achieve the required BER. Each channel must have the appropriate individual weight applied so that the correct relative amplitudes are transmitted. After the weighting operation the individual data streams become multibit values. The data streams are summed together in a large digital summing circuit that consists of a tree of numerous two input adders.

The weighted and summed digital values are then filtered in a conventional FIR filter. The FIR filter is required to pulse shape the input waveforms while suppressing out-of-band emissions. The multipliers in the FIR must handle the multibit data and coefficients to the desired precision.

In FIG. 4B, four signal channels are input individually into separate FIR filters 20 (the clock signal has been omitted for clarity). The individually filtered signals are then weighted using multipliers 24 with a channel specific weighting coefficient 37 $w_{(i)}$ for power control (equalizing the power or gain between individual channels) before being input to a multichannel summer 46. Since all users occupy the same frequency spectrum and time allocation in spread spectrum communication systems, it is desired that each user is received with the same power level. The result, $y_{(i)k}$ 44, is a weighted sum of the individually FIR filtered multiple signal channels.

A CDMA transmitter combines many channels of varying types of digital signals (serial digital voice, power control, ISDN data). Typically, each channel is modulated with a different spreading code. The spreading code allows a CDMA receiver to recover the combined signals by use of the proper code during demodulation. Alternatively, any set of orthogonal functions could be combined with the preferred embodiment and later separated by correlation. The output 44 of the multichannel FIR filter 40 is a weighted and filtered average. Although each channel has been described as a single bit valued serial data stream, multi-bit values or levels may be processed with the identical multichannel filter structure.

Figure 5:
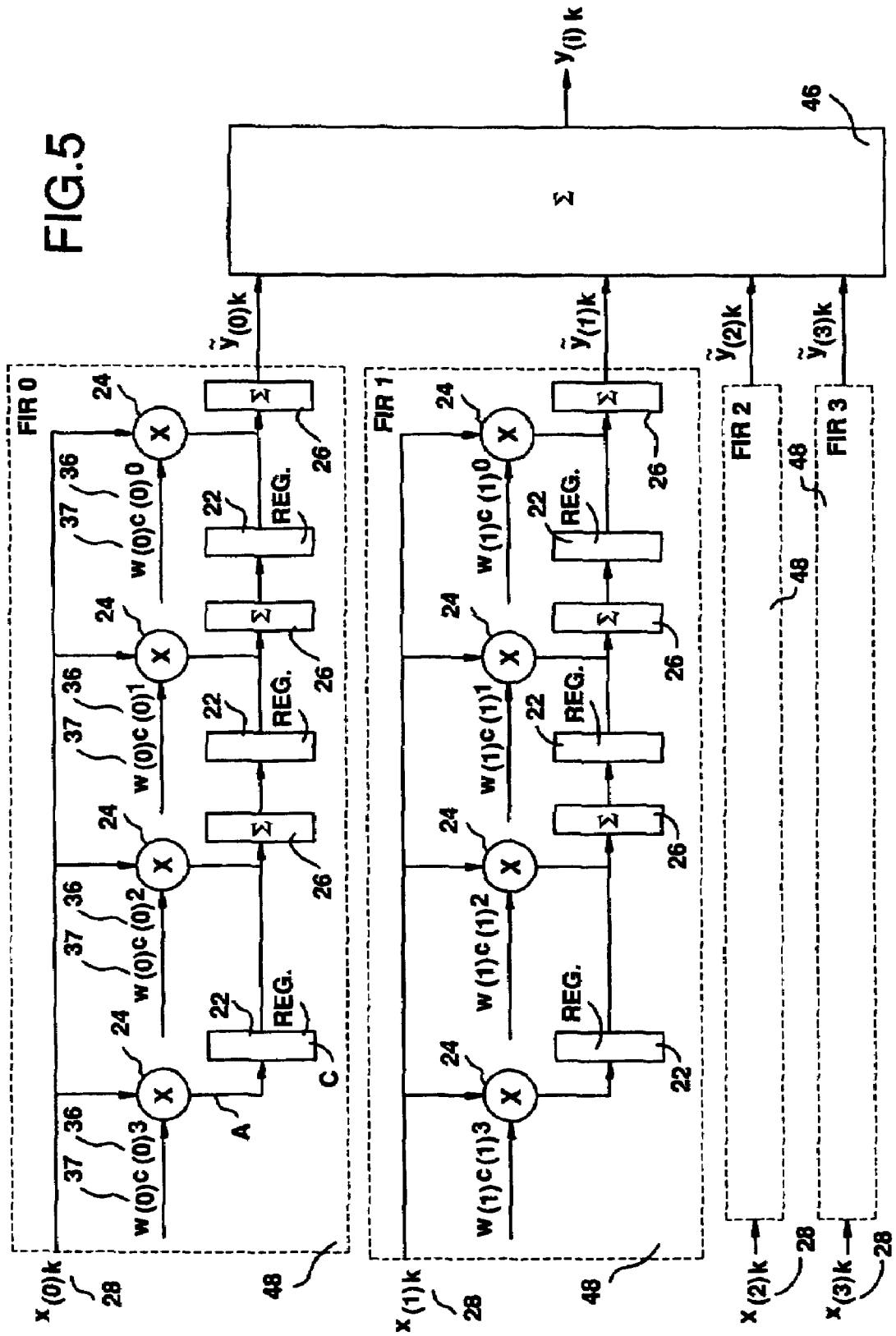
FIG. 5 is a block diagram showing a first refinement.

Referencing FIG. 5, the multichannel FIR filter 40 is shown using four tap FIR filters 48. The weighting of the discrete samples is performed by conventional multipliers 24. Each FIR structure is comprised of shift registers 22 and summers 26 for past 32 and present 34 sampled signals. Each tap weight coefficient 36 is multiplied by the respective channel power control weighting factor 37. The result is the same as shown in FIG. 4B, but with the external multipliers inside the FIR 48 structures.

Figure 6:
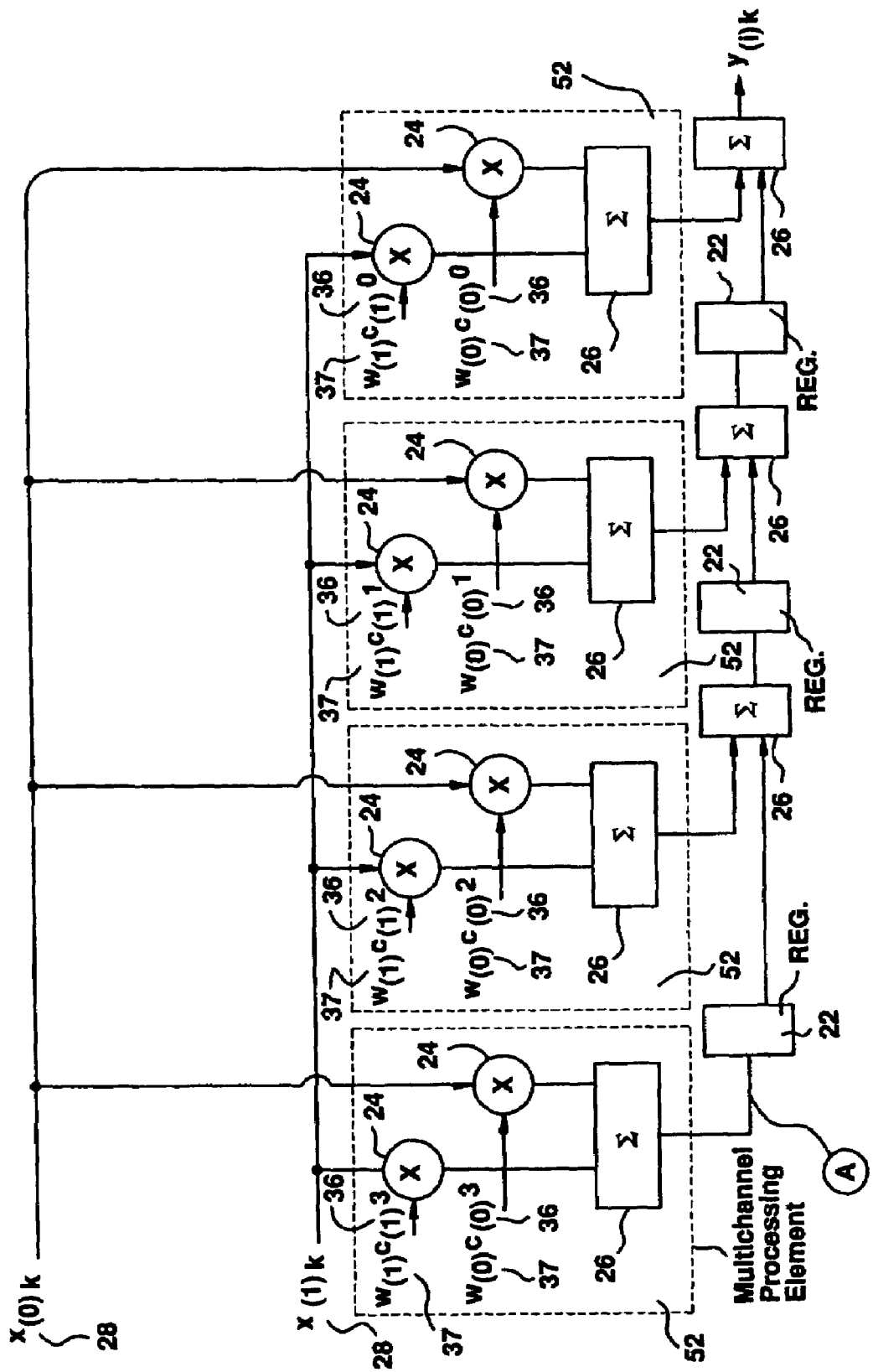
FIG. 6 is a block diagram showing a second refinement.

Hardware reduction is accomplished by sharing FIR registers and adders as shown in FIG. 6. Each multichannel processing element 52 performs part of the channel weighting 37, the FIR tap coefficient 36 multiply 24, and the summing 26 of the multiple channels for that tap. The partitioning of the discrete functions reveals the preferred embodiment.

Figure 8A:
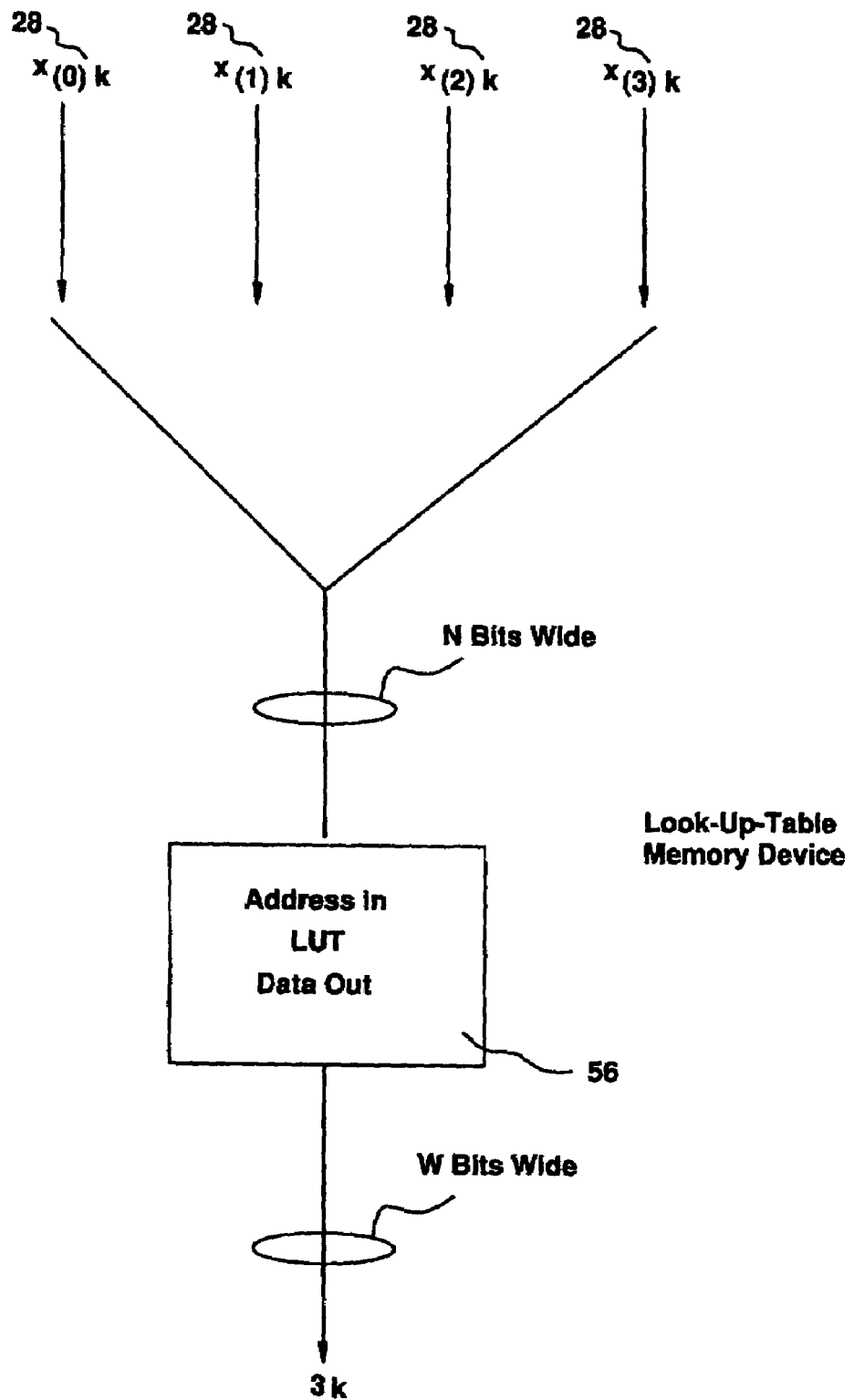
FIG. 8A is a global block diagram of a LUT.

FIG. 7 shows the multichannel processing element 52 as a processing block with AN@ single bit input signals $x_{(o)k}$, $x_{(1)k}, \ldots, x_{(N)k}$. The computed output $z_k$ 54 contains AW@ bits of resolution. The discrete input signals 28 form a vector. This vector can be assigned an overall value by weighting each bit with an increasing power of two. In the alternative, the multichannel signal bits are treated as a binary valued word. The output of the processing block is a AW@ bit wide function of the N bit binary input argument. The block performs the equivalent logical function of a memory device where the input signal bits form an address and the computed values are contents of the selected memory word. A memory based Look-Up-Table (LUT) 56 can perform an arbitrary function quickly and efficiently as shown in FIG. 8A.

A mathematical function $f$ of an argument x with a result of y is expressed as $y=f(x)$. The function performs a mapping of all values of x into another space of y values. A LUT performs this mapping for the values of interest in the preferred embodiment. The LUT memory device is presented with an address of a location within the memory circuit. The value previously stored at that location is delivered to the memory output data bus. The values of interest of x, which are discrete, are mapped into a binary number. Since the multichannel signals are represented by zero or one logic levels, they are used as bits to form a binary number. Every possible combination of channel values is therefore assigned a state number. This operation is represented as $$A = \sum_{j=0}^{M-1} x_j 2^j \qquad (9)$$
$$= x_{M-1} 2^{M-1} + \ldots x_3 2^3 + x_2 2^2 + x_1 2^1 + x_0 2^0$$
$$= x_{M-1} 2^{M-1} + \ldots x_3 8 + x_2 4 + x_1 2 + x_0.$$

Each state is a binary number that references an address in the LUT. The output value from the LUT is the precomputed value of the function resultant that would occur given the argument corresponding to that address. This is illustrated as a tabular representation of the LUT contents. The function to be performed is the weighted sum of the multiple channels for a given single tap of the FIR structure.

For example, in an application using 4 channels (M=4), the LUT contents located at the 2nd tap of the multichannel FIR (j=2) would be as shown in Table 1.

TABLE 1

| Values of x x3, x2, x1, x0 | Address Computation of A | LUT Value Stored At Location A |
|---|---|---|
| 0 0 0 0 | 0 | 0 |
| 0 0 0 1 | 1 = 1 | w0c2 |
| 0 0 1 0 | 2 = 2 | w1c2 |
| 0 0 1 1 | 2 + 1 = 3 | w1c2 + w0c2 |
| 0 1 0 0 | 4 = 4 | w2c2 |
| 0 1 0 1 | 4 + 1 = 5 | w2c2 + w0c2 |
| . | . | . |
| . | . | . |
| . | . | . |
| 1 1 0 1 | 8 + 4 + 1 = 13 | w3c2 + w2c2 + w0c2 |
| 1 1 1 0 | 8 + 4 + 2 = 14 | w3c2 + w2c2 + w1c2 |
| 1 1 1 1 | 8 + 4 + 2 + 1 = 15 | w3c2 + w2c2 + w1c2 + w0c2 |

The LUT 56 memory words contain precomputed values corresponding to the current input address value as shown in FIG. 8B. The memory can be implemented in either ROM or RAM, depending upon the application.

In the preferred embodiment, ROM (read only memory) is used to store permanent LUT values. This is implemented efficiently as an integrated circuit. ROM is appropriate for time invariant systems where the required channel weights and filter coefficients are known a priori. RAM (random access memory) allows new values to be written over old. LUT values can be computed and loaded to achieve adaptivity. RAM is not as space efficient as ROM but is still efficient considering the increased flexibility.

The preferred embodiment of the multichannel FIR filter 40 for CDMA modems according to the present invention is shown in FIG. 9. The filter structure uses LUTs 56 rather than the inefficient multichannel processing elements 52 which require a plurality of multipliers 24 and summers 26.

The signal bits form the address word which is applied to the LUT 56. There is a LUT 56 for each filter tap required. The contents of each LUT 56 is computed $$L_j(D_N, D_{N-1}, \ldots, D_2, D_1) = C_j \sum_{i=1}^{N} D_i W_i. \quad (10)$$

As shown, any combination of signal values has its weighted sum precomputed. The multiplication of each tap coefficient of the FIR function is included in the precomputed table.

The weighted and filtered single channel operation of FIG. 4A with and N tap FIR can be expressed as $$y_{(i)k} = w_i \sum_{j=0}^{N-1} c_{(i)j} x_{(i)k-j} = w_i [c_{(i)j} * x_{(i)j}]. \quad (11)$$

An M channel multichannel version of this is shown in FIG. 4B and can be expressed as $$y_{(i)k} = \sum_{i=0}^{M-1} y_{(i)k} = \sum_{i=0}^{M-1} \left( w_i \sum_{i=0}^{M-1} c_{(i)j} x_{(i)k-j} \right), \quad (12)$$

$$y_{(i)k} = \sum_{i=0}^{M-1} w_i [c_{(i)} * x_{(i)j}]. \quad (13)$$

This is the desired weighted sum of convolutions or FIR filtering operations. The convolution is performed in FIR filters 20, the weighting in multipliers 24 and the summation in adders 46. The convolution achieved is identical to that originally presented in Equation 3. The summation and weights are a result of the extension to a multichannel process.

The preferred embodiment shows an improved filter for multichannel CDMA FIR filtering modem applications. It has been shown that the signal processing operation over multiple channels, as shown in FIG. 4B, can be implemented using no multipliers and a reduced number of adders.

While specific embodiments of the present invention have been shown and described, many modifications and variations could be made by one skilled in the art without departing from the spirit and scope of the invention. The above description serves to illustrate and not limit the particular form in any way.

What is claimed:

1. An application-specific integrated circuit (ASIC) for use in wireless telecommunication systems, said ASIC comprising a multi-channel finite impulse response (FIR) filter, wherein said FIR filter comprises:
    a plurality of filter inputs, each input comprising a channel;
    a filter output;
    first and second memories, each memory coupled to said plurality of filter inputs and each memory having an output;
    a first storage register having an input coupled to the output of said first memory and having an output;
    a first summer having a first input coupled to said first storage register and a second input coupled to the output of said second memory, said first summer having an output; and
    a second storage register coupled to said output of said first summer and having an output wherein said output of said second storage register comprises said filter output.

2. The ASIC of claim 1 wherein said ASIC is configured to operate in a mobile terminal.

3. The ASIC of claim 1 wherein said ASIC is configured to operate in a base station.

4. The ASIC of claim 1 wherein said FIR filter further comprises:
    a third memory coupled to said plurality of filter inputs and having an output;
    a second summer having a first input coupled to said second storage register and a second input coupled to the output of said third memory, said second summer having an output;
    a third storage register coupled to said output of said second summer wherein said output of said third storage register comprises said filter output.

5. The ASIC of claim 4 wherein said FIR filter further comprises:
    a fourth memory coupled to said plurality of filter inputs and having an output; and a third summer having a first input coupled to said third storage register and a second input coupled said fourth memory and having an output; wherein said output of said third summer comprises said filter output.

6. The ASIC of claim 1 wherein each memory further comprises a plurality of memory locations, each having a unique address, for storing a pre-computed value; whereby said location is accessed when said address is input into said plurality of filter inputs.

7. The ASIC of claim 6 wherein each filter input transmits a serial bit stream and the plurality of filter inputs comprise an input vector.

8. The ASIC of claim 7 wherein said pre-computed value represents a weighted sum of convolutions, and said unique address is provided by said input vector.

9. The ASIC of claim 8 wherein said weighted sum includes digital filter tap coefficients and channel weights.

10. The ASIC of claim 7 wherein each said memory is a read only memory.

11. The ASIC of claim 7 wherein each said memory is a random access memory.

12. The ASIC of claim 11 wherein said FIR filter further comprises means capable of overwriting said values; wherein said filter inputs are computed using an adaption algorithm and each said random access memory is selectively overwritten as a result of said computation.

13. An ASIC for use in wireless communication systems, said ASIC comprising, in part, a multi-channel FIR filter, said FIR filter comprising:
a plurality of filter inputs;
a filter output;
an addresser that is responsive to said plurality of filter inputs and generates a plurality of memory addresses;
a plurality of memories coupled to said addressing means having a plurality of memory locations, each location corresponding to a memory address;
each memory representing an individual tap of said digital filter and each said location for storing a pre-computed weighting coefficient representing partial product weighted sums of convolutions of said digital filter;
a first storage register coupled to a first memory representing a first individual tap;
a first summer coupled to said first storage register and a second memory and having an output;
a second storage register coupled to said first summer representing a second individual tap;
a second summer coupled to said second storage register and a third memory and having an output;
a third storage register coupled to said second summer representing a third individual tap; and
a third summer coupled to said third storage register and a fourth memory to provide said filter output.

14. The ASIC of claim 13 wherein:
each said filter input provides a serial digital bit stream and said plurality of filter inputs are synchronized to provide a vector;
said addressing means generates a memory address in response to said vector;
each said memory outputs a pre-computed weighted sum stored said addressed memory location; and
said plurality of storage registers and said plurality of summers combine said memory outputs into a sum of products representative of a weighted sum of said filter inputs to provide said filter output.

15. The ASIC of claim 14 wherein each said memory is a read only memory.

16. The ASIC of claim 14 wherein each said memory is a random access memory.

17. The ASIC of claim 14 wherein said FIR filter further comprises means capable of selectively overwriting the contents of said memory locations.

18. The ASIC of claim 13 wherein said ASIC is configured to operate in a mobile terminal.

19. The ASIC of claim 13 wherein said ASIC is configured to operate in a base station.

20. An application-specific integrated circuit (ASIC) for use in wireless code division multiple access (CDMA) telecommunication systems, said ASIC comprising a multi-channel finite impulse response (FIR) filter, wherein said FIR filter comprises:
a plurality of filter inputs, each input comprising a channel;
a filter output;
first and second memories, each memory coupled to said plurality of filter inputs and each memory having an output;
a first storage register having an input coupled to the output of said first memory and having an output;
a first summer having a first input coupled to said first storage register and a second input coupled to the output of said second memory, said first summer having an output; and
a second storage register coupled to said output of said first summer and having an output wherein said output of said second storage register comprises said filter output.

21. An ASIC for use in wireless code division multiple access (CDMA) communication systems, said ASIC comprising, in part, a multi-channel FIR filter, said FIR filter comprising:
a plurality of filter inputs;
a filter output;
an addresser that is responsive to said plurality of filter inputs and generates a plurality of memory addresses;
a plurality of memories coupled to said addressing means having a plurality of memory locations, each location corresponding to a memory address;
each memory representing an individual tap of said digital filter and each said location for storing a pre-computed weighting coefficient representing partial product weighted sums of convolutions of said digital filter;
a first storage register coupled to a first memory representing a first individual tap;
a first summer coupled to said first storage register and a second memory and having an output;
a second storage register coupled to said first summer representing a second individual tap;
a second summer coupled to said second storage register and a third memory and having an output;
a third storage register coupled to said second summer representing a third individual tap; and
a third summer coupled to said third storage register and a fourth memory to provide said filter output.

* * * * *

UNITED STATES PATENT AND TRADEMARK OFFICE
CERTIFICATE OF CORRECTION

PATENT NO. : 7,631,027 B2　　　　　　　　　　　　　　　　　　　　　　Page 1 of 1
APPLICATION NO. : 11/141622
DATED : December 8, 2009
INVENTOR(S) : Robert T. Regis It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1213 days.

Signed and Sealed this

Twenty-first Day of December, 2010

David J. Kappos
*Director of the United States Patent and Trademark Office*